(12) United States Patent
Ballagh et al.

(10) Patent No.: US 7,478,030 B1
(45) Date of Patent: Jan. 13, 2009

(54) CLOCK STABILIZATION DETECTION FOR HARDWARE SIMULATION

(75) Inventors: Jonathan B. Ballagh, Longmont, CO (US); Roger B. Milne, Boulder, CO (US); Jeffrey D. Stroomer, Lafayette, CO (US); L. James Hwang, Menlo Park, CA (US); Nabeel Shirazi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 637 days.

(21) Appl. No.: 10/600,848

(22) Filed: Jun. 19, 2003

(51) Int. Cl.
*G06F 17/50* (2006.01)
*G06F 9/45* (2006.01)

(52) U.S. Cl. .................. 703/19; 716/4; 716/6
(58) Field of Classification Search ............ 703/19
See application file for complete search history.

(56) References Cited

U.S. PATENT DOCUMENTS

| | | | | |
|---|---|---|---|---|
| 4,872,155 A | * | 10/1989 | Yokogawa et al. | 369/47.28 |
| 5,243,637 A | * | 9/1993 | Flaherty et al. | 377/95 |
| 5,347,559 A | * | 9/1994 | Hawkins et al. | 377/54 |
| 5,535,377 A | * | 7/1996 | Parks | 713/400 |
| 5,625,580 A | * | 4/1997 | Read et al. | 703/21 |
| 5,920,600 A | * | 7/1999 | Yamaoka et al. | 375/376 |
| 6,208,671 B1 | * | 3/2001 | Paulos et al. | 370/545 |
| 6,487,648 B1 | * | 11/2002 | Hassoun | 711/167 |
| 6,782,486 B1 | * | 8/2004 | Miranda et al. | 713/601 |
| 6,801,146 B2 | * | 10/2004 | Kernahan et al. | 341/122 |
| 6,977,879 B1 | * | 12/2005 | Hamada et al. | 369/53.34 |
| 7,015,727 B2 | * | 3/2006 | Balasubramanian | 327/49 |
| 2003/0091267 A1 | * | 5/2003 | Alvarez et al. | 385/16 |
| 2004/0000939 A1 | * | 1/2004 | Meguro | 327/160 |

OTHER PUBLICATIONS

U.S. Appl. No. 09/981,503, filed Oct. 16, 2001, Hwang et al.

* cited by examiner

*Primary Examiner*—Paul L Rodriguez
*Assistant Examiner*—Andre Pierre Louis
(74) *Attorney, Agent, or Firm*—W. Eric Webostad

(57) ABSTRACT

Method and apparatus for clock stabilization detection for hardware simulation is described. More particularly, a lock signal is obtained, for example from a digital clock module. A least common multiple (LCM) clock signal is generated, for example from a clock module. A control signal is generated at least partially responsive to the LCM clock signal and the lock signal. The control signal may be generated from a state machine and applied to select circuitry, where the control signal is used to mask application of the output clock signal responsive to the control signal.

24 Claims, 8 Drawing Sheets

CLOCK STABILIZATION DETECTION FOR HARDWARE SIMULATION

FIELD OF THE INVENTION

One or more aspects of the invention generally relate to clock stabilization detection for hardware simulation, and more particularly to clock signal lock and phase alignment for testing an integrated circuit, having programmable logic.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, called a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs), and support circuitry such as digital clock managers (DCMs) having delay lock loops (DLLs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

Conventionally, such a bitstream is generated from tools for implementing a design from at least one of a schematic capture of the design and a hardware description language ("HDL") version of the design, such as verilog or Very High Speed Integrated Circuit ("VHSIC") HDL ("VHDL"), to provide a textual description of circuitry ("text-circuit description") that is synthesized and implemented. A more recent addition to HDL involves use of a programming language, such C/C++ as in SystemC from Synopsys of Mountain View, Calif., to generate a circuit design that may be synthesized and implemented.

Circuit synthesis is used in designing all types of complex integrated circuits. One use is for designing hardwired circuitry, such as in FPGAs, processors, Application Specific Standard Products (ASSPs), and the like. Another use is for designing Application Specific Integrated Circuits (ASICs), including ASIC standard cells, where a vendor or customer uses synthesis tools to programmatically configure logic built on such an integrated circuit. Another use of synthesis tools is programmatically configuring a portion of an FPGA to provide a design. For purposes of clarity, an FPGA integrated circuit is described, though it will be apparent that any integrated circuit of sufficient complexity designable with synthesis tools may be implemented.

Once a design is created and implemented ("hardware implementation"), for example for an FPGA, it may be tested. Testing is useful to ensure that a hardware implementation functions equivalently to an HDL or higher-level abstraction, from which such hardware implementation was derived, implemented on a computer with simulation tools ("computer implementation"). For example, known high-level software tools, such as SystemC, System Generator for DSP from Xilinx of San Jose, Calif., and MATLAB and Simulink from The MathWorks of Natick, Mass., among others, facilitate circuit design and simulation at higher-levels of abstraction than classical hardware design. Furthermore, software tools, such as SystemC and System Generator for DSP, among others, have design conversion capability to covert a design into a synthesizable text-circuit description.

A computer implementation is compared to a hardware implementation counterpart by providing like input stimulus to each and comparing test results. This may be done by co-simulation, or by comparing test results from a hardware implementation to "known good" results from a computer simulation. Conventionally, "known good" results or "golden vectors" ("target test results") are obtained from a predetermined set of input test vectors. Thus, output test vectors, which may be compressed, from a hardware implementation are compared against target test results.

However, in contrast to computer simulations, hardware implementations conventionally have a clock stabilization problem, especially when multiple clock signals are derived from a single input clock source. For example, multiple clock signals generated from a single DLL may experience stabilization problems. In hardware implementations, there is an initial interval after startup when clocks may be unstable, and where related clock signals may not be phase aligned. After this initial interval, clocks conventionally stabilize and rising edges of related clocks are conventionally phase aligned to be within tolerance. However, because a computer simulation does not have clock constraints equivalent to those of a hardware implementation counterpart during a post-startup interval, there is ambiguity with respect to when to compare hardware implementation test results to target test results.

Accordingly, it would be both desirable and useful to provide means to identify when clock stabilization of a hardware implementation occurs to reduce ambiguity in comparing test results.

SUMMARY OF THE INVENTION

An aspect of the invention is an apparatus for clock stabilization detection for hardware simulation. A digital clock module is for receiving an input clock signal and a feedback clock signal and for providing an output clock signal. The digital clock module is configured to lock the feedback clock signal relative to the input clock signal and configured to produce a least common multiple (LCM) clock signal and a lock signal. A state machine is for receiving the lock signal and the LCM clock signal and is configured to provide a control signal at least partially responsive to the LCM clock signal and the lock signal. A select circuit is for receiving the control signal and the output clock signal and configured to mask application of the output clock signal responsive to the control signal.

Another aspect of the invention is a method for clock stabilization detection for hardware simulation. An input clock signal is received. A feedback clock signal is produced from the input clock signal. An output clock signal is produced from the input clock signal. The feedback clock signal is locked relative to the input clock signal to produce a lock signal. A least common multiple (LCM) clock signal is generated. A control signal is generated at least partially responsive to the LCM clock signal and the lock signal. Application of the output clock signal is masked responsive to the control signal.

Another aspect of the invention is a computer-readable medium having instructions executable by a programmed computer to perform a method for clock stabilization detection for hardware simulation, the method comprising: obtaining a lock signal; obtaining a least common multiple (LCM) clock signal; and generating a control signal at least partially responsive to the LCM clock signal and the lock signal, the control signal for masking application of the output clock signal responsive to the control signal.

BRIEF DESCRIPTION OF THE DRAWINGS

Accompanying drawing(s) show exemplary embodiment (s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
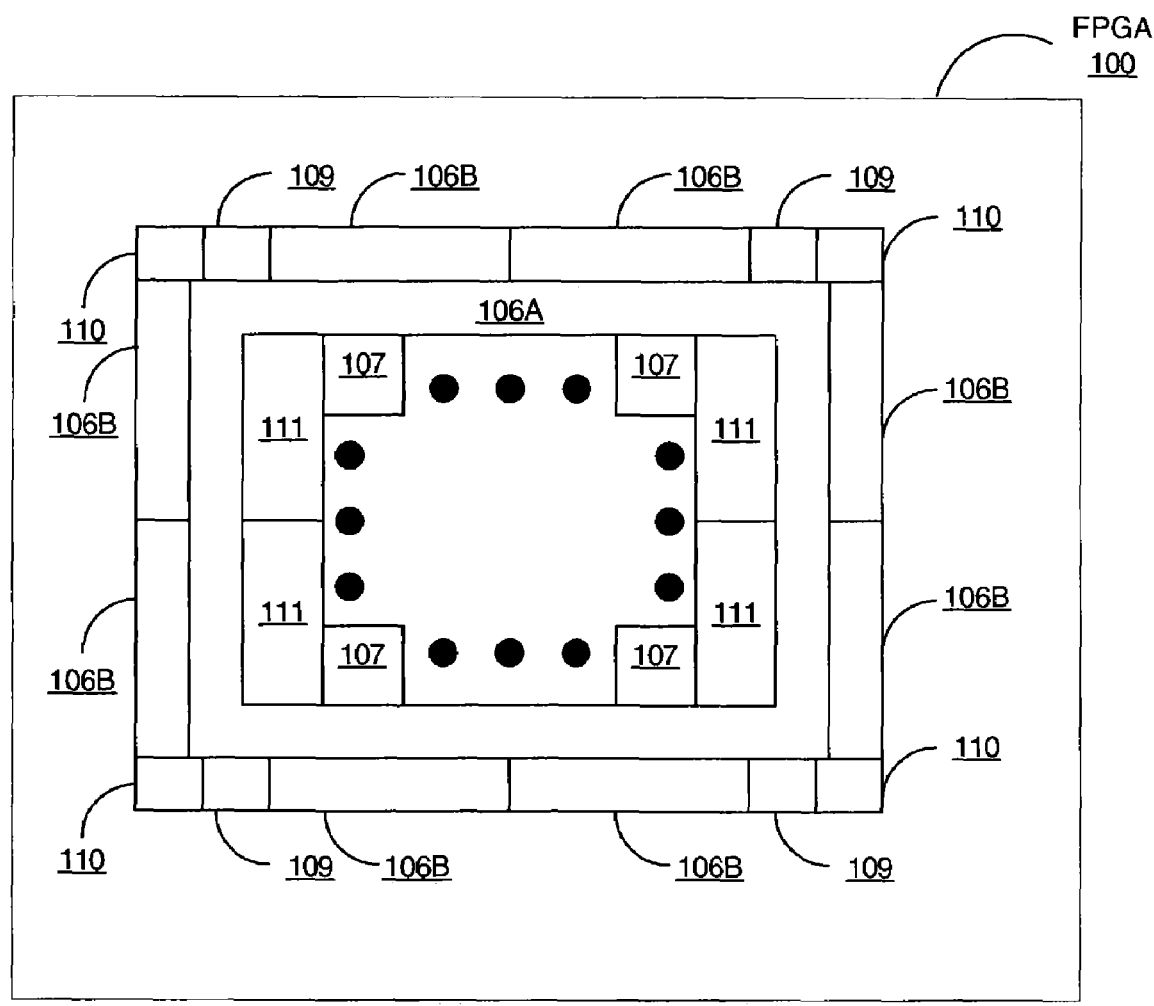
FIG. 1 is a high-level block diagram of an exemplary embodiment of an FPGA.

FIG. 1 is a high-level block diagram of an exemplary embodiment of a well-known FPGA 100. An FPGA is an example of an integrated circuit that may be used for implementing one or more aspects of the invention. However, other integrated circuits, as well as configurations of FPGAs other than FPGA 100, may be used. For example, PLDs other than FPGAs, microprocessors, Application Specific Standard Products (ASSPs), Digital Signal Processors (DSPs), Application Specific Integrated Circuits (ASICs) including ASIC standard cells, and the like.

FPGA 100 includes configurable logic blocks (CLBs) 107, I/O routing ring 106A, memory, such as random access memory 111, delay lock loops (DLLs) 109, multiply/divide/de-skew clock circuits 110, and programmable input/output blocks (IOBs) 106B. DLLs 109 and clock circuits 110 collectively provide digital clock modules or managers (DCMs). De-skew clock circuits 110 may include adjustable delay line (ADLs), such as tap-controlled delay lines, configurable to adjust clock signal outputs locked with DLLs 109 to one or more external clock signals. As output clock signals may be skewed with respect to one another by factors such as capacitive and resistive loading and by propagation delay, ADLs may be adjusted to compensate for such skews to obtain at least proximal phase alignment, namely, phase alignment within some tolerance range subject to granularity of one or more ADLs, such as for macro and micro adjustable configurations of ADLs.

Figure 2:
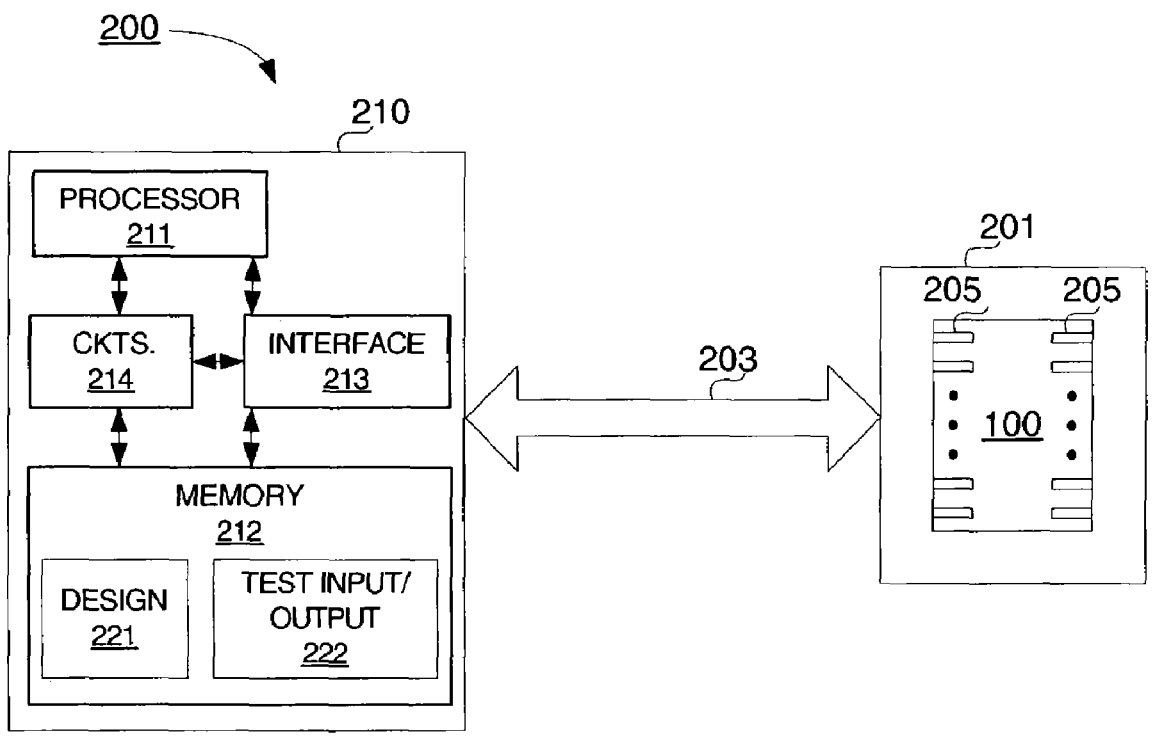
FIG. 2 is a high-level block diagram of an exemplary embodiment of a test system.

FIG. 2 is a high-level block diagram of an exemplary embodiment of a test system 200. Test system 200 includes a programmed computer 210 and an integrated circuit test card 201, which may be put in communication with one another via command/address/data bus 203. Input/output pins 205 of FPGA 100 may be used to couple FPGA 100 for communication with programmed computer 210 via command/address/data bus 203 and test card 201.

Programmed computer 210 includes a central processing unit (CPU) 211, memory 212, a variety of support circuits 214, and an input/output (I/O) interface 213. CPU 211 may be any type of microprocessor known in the art. Support circuits 214 for CPU 211 include conventional cache, power supplies, clock circuits, data registers, I/O interfaces, and the like. Memory 212 may be directly coupled to CPU 210 or coupled through I/O interface 213, and I/O interface may be coupled to a conventional keyboard, network, mouse, display printer, and interface circuitry adapted to receive and transmit data, such as data files and the like.

Memory 212 may store all or portions of one or more programs or data to implement processes in accordance with one or more aspects of the invention. Additionally, those skilled in the art will appreciate that one or more aspects of the invention may be implemented in hardware, software, or a combination of hardware and software. Such implementations may include a number of processors independently executing various programs and dedicated hardware, such as application specific integrated circuits (ASICs).

Programmed computer 210 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in memory 212. Memory 212 may include one or more of the following random access memory, read only memory, magneto-resistive read/write memory, optical read/write memory, cache memory, magnetic read/write memory, and the like, as well as signal-bearing media as described below.

Memory 212 may store all or a portion of a input test vectors and target test results 222, simulation tools and a design 221 for a clock stabilization circuit, which may be wholly or partially configured in FPGA 100 by programmed computer 210 via command/address/data bus 203.

One or more aspects of the invention are implemented as program products for use with computer 210. Program(s) of the program product defines functions of embodiments in accordance with one or more aspects of the invention and can be contained on a variety of signal-bearing media, such as computer-readable media having code, which include, but are not limited to: (i) information permanently stored on non-writable storage media (e.g., read-only memory devices within a computer such as CD-ROM or DVD-RAM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of one or more aspects of the invention represent embodiments of the invention.

Figure 3A:
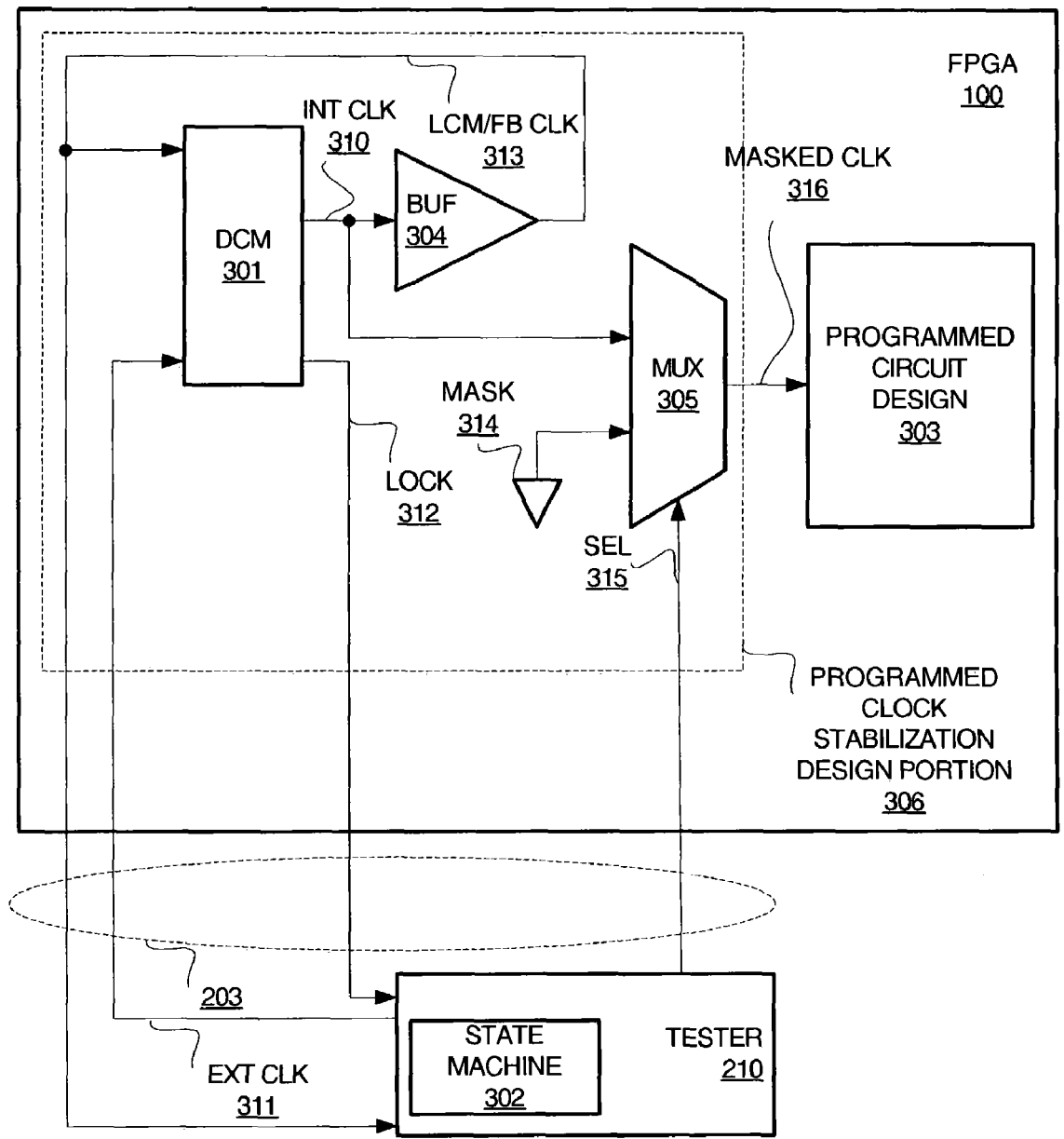
FIGS. 3A and 3B are schematic diagrams of respective exemplary embodiments of an FPGA, for example as in FIG. 1, configured with a design and coupled to a tester, for example as in FIG. 2.

FIG. 3A is a schematic diagram of an exemplary embodiment of FPGA 100 having configurable logic configured with a programmed circuit design 303 and coupled to programmed computer ("tester") 210. A programmed clock stabilization design portion 306 is used to configure a portion of FPGA 100 for providing a masked clock signal 316 to programmed circuit design 303. Masked clock signal 316 is provided after clock stabilization has been detected, as follows.

An external clock signal 311 is provided from tester 210, or other clock source, to DCM 301 of FPGA 100. From input clock signal 311, one or more output clock signals are provided. These one or more output clock signals may be same or faster in frequency than input clock signal 311, and one of which may be slower in frequency than input clock signal 311. DCM 301, in this example, generates a single output clock from input clock signal 311, namely, internal clock signal 310. In this example, internal clock signal 310 is used both as a feedback clock signal and a least common multiple (LCM) clock signal 313. For example, if two output clock cycles were generated by DCM 301 having normalized periods of 2 units and 3 units, LCM clock signal would have a period of 6 units. Of course, this is just an example, and any number of periods may be used to determine period of an LCM clock signal. Though, one DCM 301 is shown, it should be understood that more than one DCM may be used depending on the number of output clock signals, as well as generation of an LCM clock signal.

As internal clock signal 310 is intended to pass through a multiplexer 305, to facilitate a reduction in skew due to propagation delay, a multiplexer 304 is configured to buffer internal clock signal 310. For clarity, a buffer 304 is shown in FIG. 3A. Buffers may have integrated clock multiplexers that allow selection between two or more inputs, especially configured for maintaining duty cycle. For example, it should be appreciated that multiplexers 304 and 305 may be part of a global clock distribution tree for FPGA 100.

Feedback clock signal 313 is input to DCM 301 for establishing a phase or frequency lock with input clock signal 311. It is useful to have feedback clock signal 313 at a same frequency as input signal 311 to facilitate alignment of coincidental edges to preserve duty cycle. For example, rising edges of feedback clock signal 313 are at least proximally aligned to rising edges of input clock signal 311.

In response to feedback clock signal 313 frequency or phase locked to input clock signal 311, DCM 301 provides an indication of a lock condition via lock signal 312. Lock signal 312 and LCM clock signal 313 are provided to tester 210 for a state machine 302, which may be instantiated in software as part of design 221 of FIG. 2. In response to LCM clock signal 313 and an indication of a lock condition from lock signal 312, state machine 302 is configured to produce a control signal, namely, select signal 315. Additionally, tester 210 has knowledge that input test vectors may be sent to FPGA 100 to test programmed circuit design 303, as an initial clock stabilization interval has thus passed.

Responsive to select signal 315, multiplexer 305 selects internal clock signal 311 instead of previously selected mask input 314, shown as at an electrical ground though another voltage level may be used to mask application of internal clock signal 311. Thus, internal clock signal is selected for masked clock signal 315.

Figure 3B:
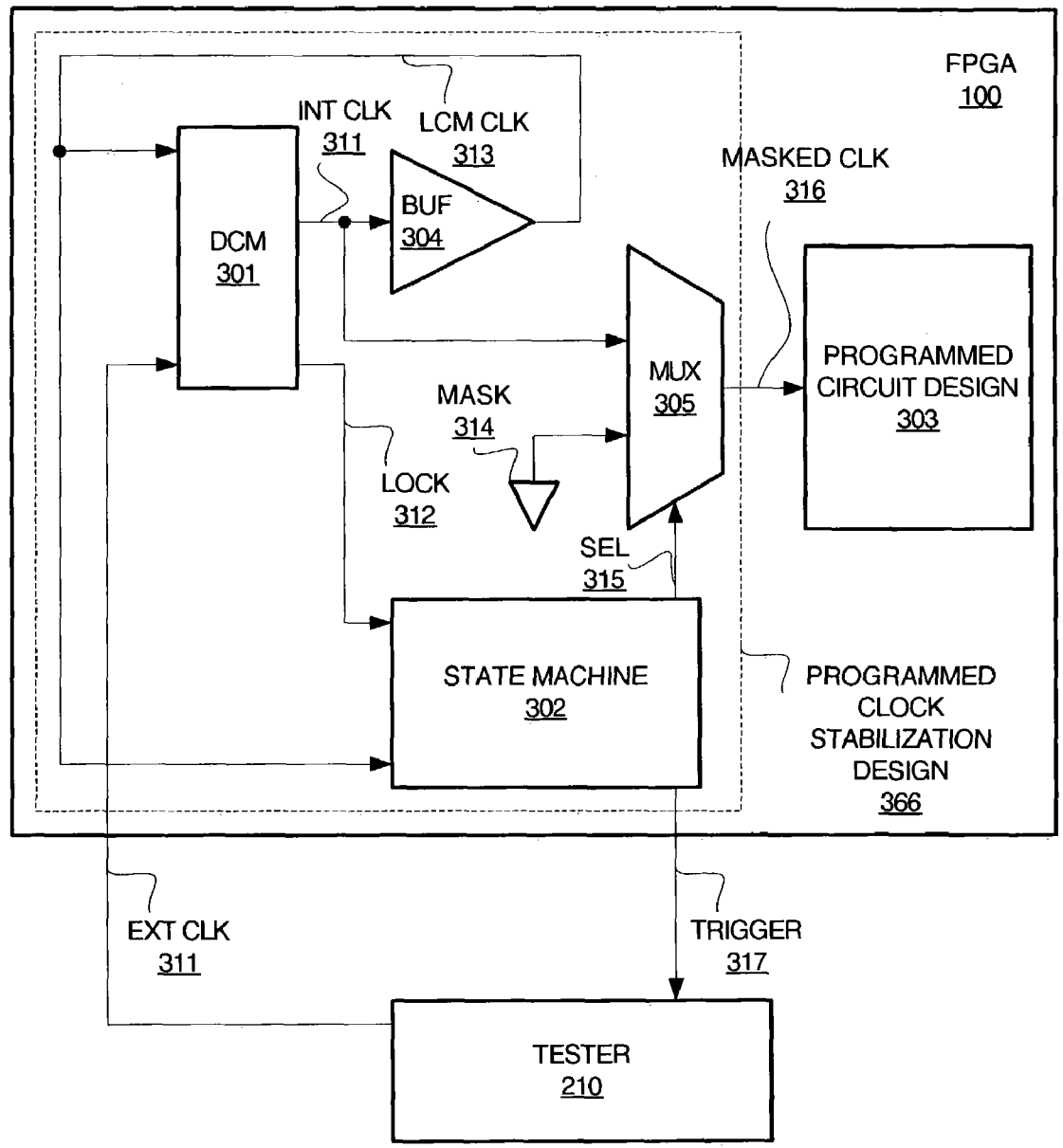

FIG. 3B is a schematic diagram of an exemplary embodiment of FPGA 100 having configurable logic configured with a programmed circuit design 303 and coupled to tester 210, where state machine 302 is configured in FPGA 100. In an embodiment where state machine is programmed into configurable logic of FPGA 100, select signal is still generated in response to LCM clock signal 313 and a lock condition as indicated by lock signal 312, and an additional signal, trigger signal 317, which may be the same signal as select signal 315, is provided to tester 210.

With reference to FIGS. 2, 3A and 3B, select signal 315 and trigger signal 317 are used to inform tester 210 that an initial clock stabilization interval has passed and that FPGA is ready to accept test vector input and provide test vector output, for example via bus 203, for programmed circuit design 303. This facilitates starting testing of a programmed circuit design 303 in a predictable, known state. Furthermore, signals 315, 317 provide triggering for synchronization of tester 210 with FPGA 100 for comparing time dependent test results. For example, suppose a circuit model of programmed circuit design 303 is simulated on tester 210 for co-simulation with programmed circuit design 303 using single-step clocking of input clock signal for providing test vector input and obtaining test vector output, then for each test vector input clock cycle the same bits are input to both software and hardware simulations and for each test vector output clock cycle bit output from software and hardware simulations may be directly compared. In other words, inputs and outputs are bitwise and cycle accurate with respect to hardware and software simulations. Notably, it is not necessary to co-simulate. Rather predetermined vector input and anticipated vector output, for example used on a previously completed software simulation, indexed to a clock may be used for comparison with a hardware simulation done at a later time.

Figure 4A:
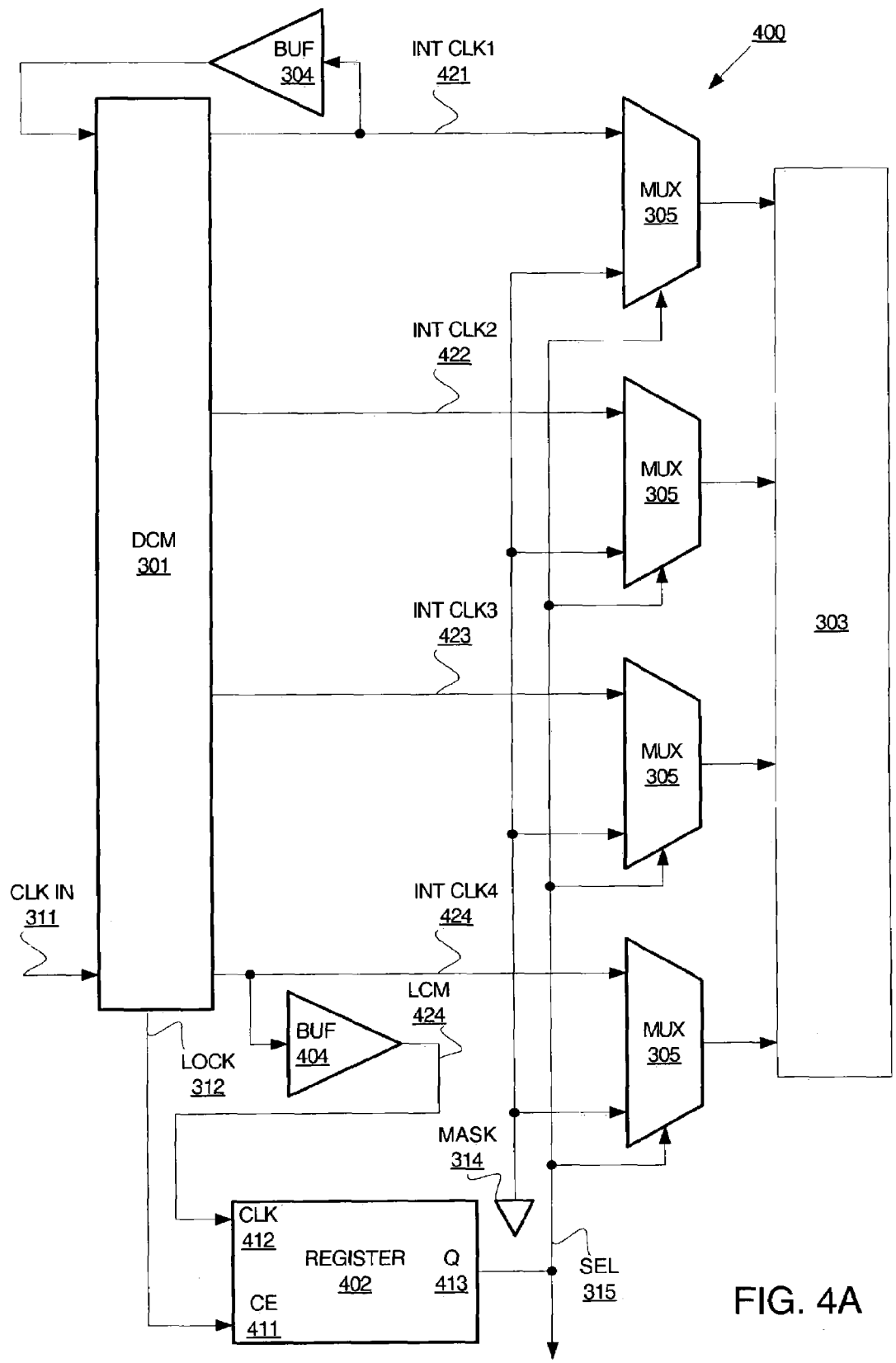
FIGS. 4A, 4B and 4C are schematic diagrams of respective alternative exemplary embodiments of clock stabilization detection circuits.
Figure 4B:
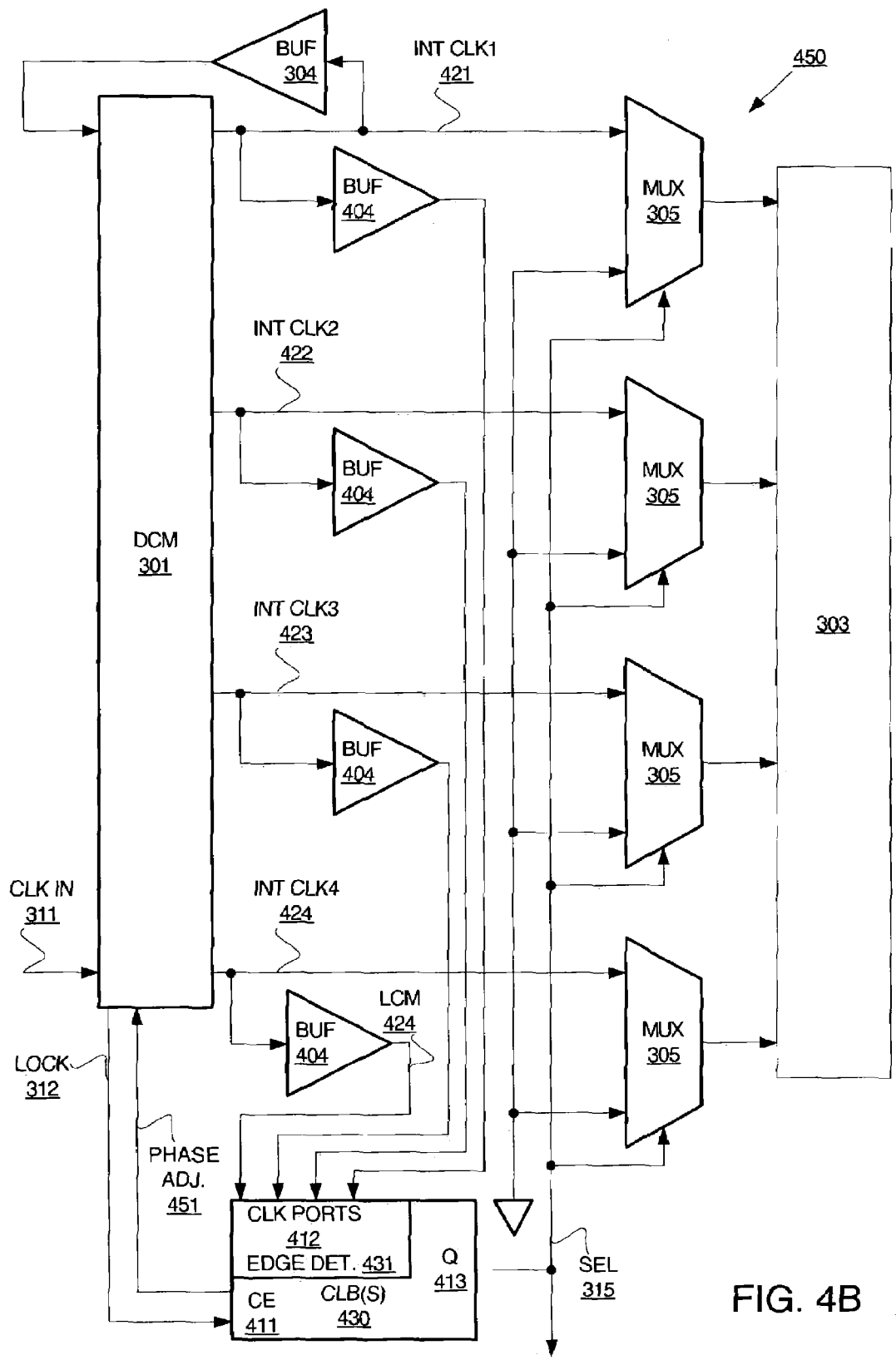
Figure 4C:
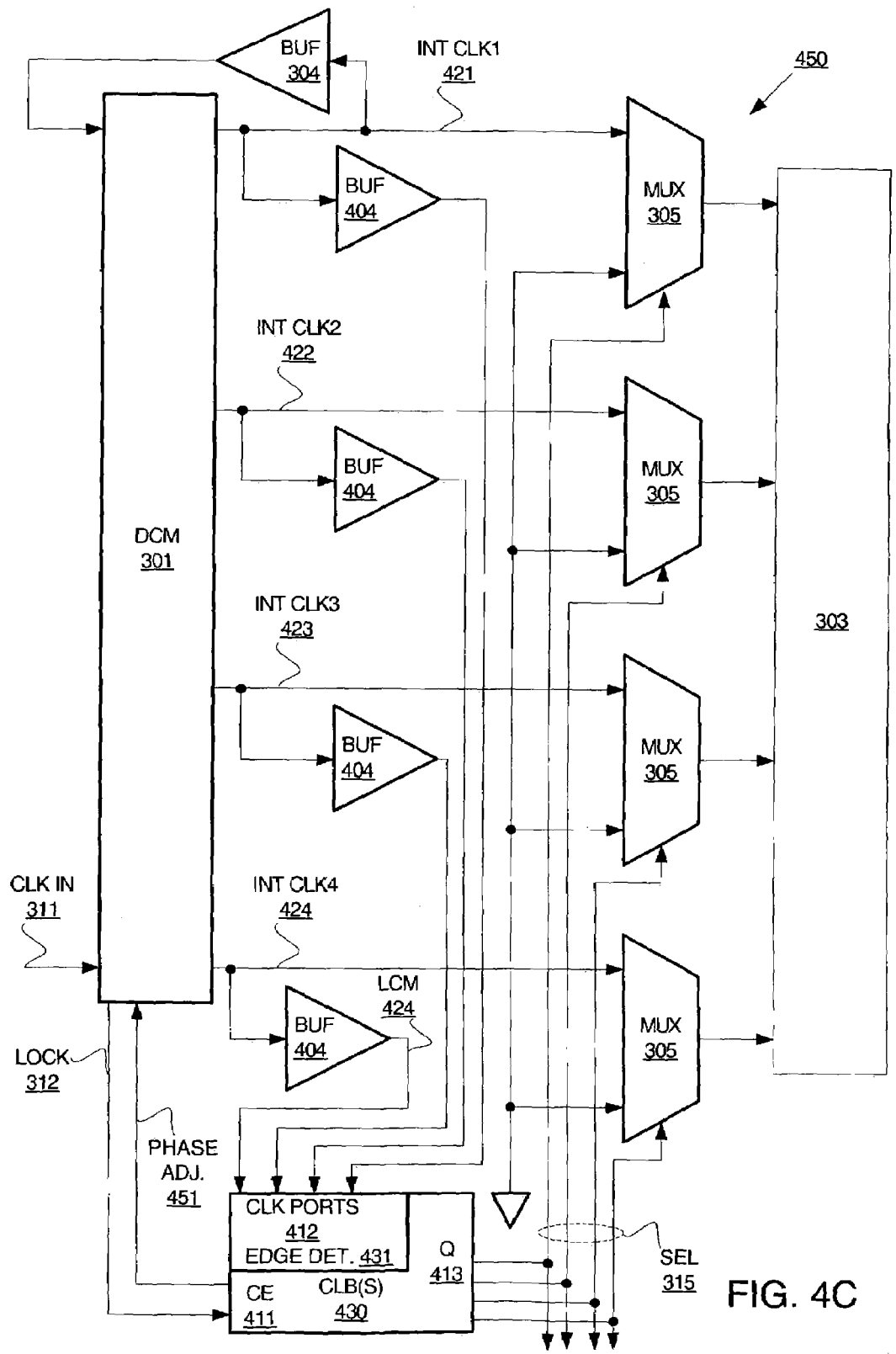

FIGS. 4A, 4B and 4C are schematic diagrams of respective alternative exemplary embodiments of clock stabilization detection circuits 400 and 450. Much of the previously described detail is applicable to FIGS. 4A, 4B and 4C and is therefore not repeated. However, rather than a single output clock, four output clocks, namely, internal clock signals 421, 422, 423 and 424, are generated. Select signal 315 is supplied to each multiplexer 305 to select between inputs. One of each of two inputs of each multiplexer is coupled to ground potential, namely, mask signal voltage 314. The other input of each of multiplexers is coupled to a respective internal clock signal 421, 422, 423 and 424. Select signal is used to select masking voltage 314 when clock signals are not stable and to select internal clock signals 421, 422, 423 and 424 when such clock signals are stable for output to programmed circuit design 303.

Internal clock signal 421 is used as a feedback clock signal to DCM 301 after passing through buffer 304 to facilitate less distortion due to skew. Internal clock signal 424 is used as an LCM clock signal after passing through buffer 404, namely, LCM clock signal 424, again to facilitate less distortion due to skew. Notably, LCM clock signal 424 is a least common multiple, as mentioned above, of internal clock signals 421, 422, 423 and 424. Buffer 404, like buffer 304, is a multiplexer 404 configured for buffering, and may be part of a global clock distribution tree of FPGA 100 of FIG. 2.

In FIG. 4A, a register 402 is used for a state machine. LCM clock signal 424 is provided to a clock port 412 of register 402, and lock signal 312 is provided to a clock enable port 411 of register 402. After LCM clock signal 424 is received by register 402 and a lock condition is obtained with respect to feedback clock signal 421 and input clock signal 311 to enable clocking of register 402, output, Q, port 413 of register 402 changes state of select signal 315. Notably, register 402 may be a one-shot register, for example a register that changes state of output, Q, on either a first rising edge or a first falling edge of LCM clock signal 424 after clocking has been enabled by lock signal 312. Select signal 315 output of register 402 in response to a lock condition and receipt of an LCM clock signal selects internal clock signals 421, 422, 423 and 424 as output for multiplexers 305. Additionally, select signal 315 may be provided to tester 210 of FIG. 2 for synchronization of test data.

Using a one-shot register to align internal clock signals 421, 422, 423 and 424 may be insufficient for designs less tolerant to phase differences between internal clock signals 421, 422, 423 and 424. Accordingly, it may be appropriate to add edge detection is more phase intolerant designs.

In FIG. 4B, each multiplexer 404 is configured for buffering a respective internal clock signals 421, 422, 423 and 424 prior to providing to one or more CLBs 430 configured as a state machine. State machine 430 may be configured to provide select signal 315, where when select signal 315 selects internal clock signals 421, 422, 423 and 424 all outputs of multiplexers 305 have at least approximately either coincidental rising or fall edges. Alternatively, separate select signals 315 delayed with respect to one another may be independently provided to respective multiplexers 305 for staggered edges of clock signals output from such multiplexers 305, as shown in the schematic diagram of FIG. 4C. Internal clock signals 421, 422, 423 and 424 are provided to respective clock ports 412 of an edge detector 431 of CLBs 430. Edge detector 431 detects whether all edges of a type, rising or falling, for all internal clock signals 421, 422, 423 and 424 are at least proximally phase aligned with respect to one another. If all internal clock signals 421, 422, 423 and 424 are not at least proximally phase aligned with respect to one another, a phase adjust signal 451 is provided to DCM 301 to bring all internal clock signals 421, 422, 423 and 424 into at least proximally phase aligned with respect to one another, and select signal 315 output from port 413 of CLBs 430 is to select a masking voltage for output of multiplexers 305. If, however, all internal clock signals 421, 422, 423 and 424 are at least proximally phase aligned with respect to one another, and if a lock condition is received to clock enable port 411, CLBs 430 are configured to provide select signal 315 to select internal clock signals 421, 422, 423 and 424 as respective outputs for multiplexers 305. Notably, as all internal clock signals 421, 422, 423 and 424 are provided to a state machine, such as configured from CLBs 430, DCM 301 may be configured to provide a least common multiple clock signal as any one of such internal clock signals 421, 422, 423 and 424. However, for clarity, it was assumed that internal clock signal 424 was an LCM clock signal for internal clock signals 421, 422, 423 and 424.

Figure 5:
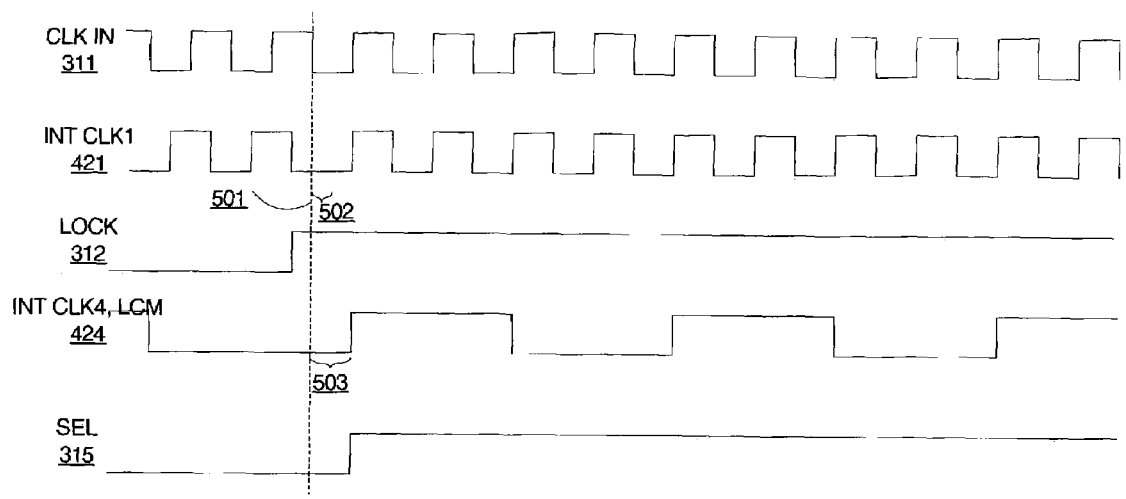
FIG. 5 is a signal diagram for the exemplary embodiment of FIG. 4.

FIG. 5 is a signal diagram for some of the signals of the exemplary embodiment of FIG. 4B. DCM 301 uses internal clock signal 421 feedback to frequency locked with input clock signal 311. In response to a frequency lock being established, lock signal 312 changes state, for example from a logic low voltage to a logic high voltage. DCM 301 phase adjusts internal clock signal 421 starting from dashed line 501 for a phase adjust 502 to be in at least proximal phase alignment with input clock signal 311. DCM 301 phase adjusts internal clock signal 424 starting from dashed line 501 for a phase adjust 503 to be in at least proximal phase alignment with input clock signal 311, and thus proximal phase alignment with internal clock signal 421. Accordingly, all internal clock signals 421, 422, 423 and 424 may be in or put in at least proximal phase alignment with one another, whether indexed to input clock signal 311 or one of internal clock signals 421, 422, 423 and 424. By phase aligning internal clock signals, a programmed circuit design under test has all edges aligned prior to receiving test vector input to facilitate bitwise and clock cycle accuracy.

Notably, though multiplexers 305 in FIGS. 3A, 3B, 4A, and 4B have been described as going from a masked clock state to an unmasked clock state. It should be appreciated that multiplexers 305 may be used to go from an unmasked clock state to a masked clock state by changing state of select signal 315.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

The invention claimed is:

1. An apparatus for clock stabilization detection for hardware simulation, comprising:
   a digital clock module for receiving an input clock signal and a feedback clock signal and for providing an output clock signal, the digital clock module configured to lock the feedback clock signal relative to the input clock signal and configured to produce a least common multiple (LCM) clock signal and a lock signal;
   a state machine for receiving the lock signal and the LCM clock signal and configured to change state of a control signal at least partially responsive to the LCM clock signal and the lock signal; and
   a select circuit for receiving the control signal and the output clock signal and configured to mask application of the output clock signal responsive to a first state of the control signal and to unmask the application of the output clock signal after the output clock signal is sufficiently stabilized as indicated by a second state of the control signal by the state machine for the hardware simulation to commence.

2. An apparatus, as in claim 1, further comprising a buffer coupled to receive the output clock signal and to provide the feedback clock signal, the output clock signal generated responsive to the input clock signal.

3. An apparatus, as in claim 1, wherein the feedback clock signal is the LCM clock signal.

4. An apparatus, as in claim 1, wherein the digital clock module is disposed in a programmable logic device (PLD), and wherein the PLD comprises a configuration logic block configured with the state machine.

5. An apparatus, as in claim 1, wherein the state machine is a register.

6. An apparatus, as in claim 1, wherein the control signal is configured to cause the select circuit to pass the output clock signal for at least approximate edge coincidence with another output clock signal.

7. An apparatus, as in claim 1, wherein the state machine comprises an edge detector configured to detect at least proximal phase alignment between the LCM clock signal and the output clock signal to provide the control signal.

8. A method for clock stabilization detection for hardware simulation, comprising:
   receiving an input clock signal;
   producing a feedback clock signal from the input clock signal;
   producing an output clock signal from the input clock signal;
   locking the feedback clock signal relative to the input clock signal to produce a lock signal;
   generating a least common multiple (LCM) clock signal;
   changing state of a control signal at least partially responsive to the LCM clock signal and the lock signal; and
   masking application of the output clock signal responsive to a first state of the control signal; and
   unmasking the application of the output clock signal after the output clock signal is sufficiently stabilized as indicated by a second state of the control signal for the hardware simulation to commence.

9. A method, as in claim 8, further comprising detecting at least proximal phase alignment between the output clock signal and the LCM clock signal to generate the control signal.

10. A method, as in claim 8, wherein the masking further masks application of the LCM clock signal responsive to the control signal.

11. An apparatus for clock stabilization detection for hardware simulation, comprising:
a digital clock module for receiving an input clock signal, the digital clock module configured to produce a plurality of output clock signals at least partially responsive to the input clock, one of the plurality of output clock signals being fed back to the digital clock module as a feedback clock signal to establish lock with the input clock signal, the digital clock module configured to produce a least common multiple (LCM) clock signal for and as part of the plurality of output clock signals, the digital clock module configured to produce a lock signal responsive to establishment of the lock;
a state machine for receiving the lock signal and the LCM clock signal and configured to change state of a control signal partially responsive to the LCM clock signal and the lock signal, the state machine including an edge detector for receiving the plurality of clock signals, the edge detector configured to detect at least proximal phase alignment of all the plurality of clock signals to produce the control signal; and
select circuits for receiving the control signal and respectively receiving the plurality of clock signals, each of the select circuits configured to mask application of a respective one of the plurality of output clock signals responsive to a first state of the control signal and to unmask the application of the plurality of output clock signals after sufficiently stabilized as indicated by a second state of the control signal for the hardware simulation to commence.

12. An apparatus, as in claim 11, wherein the lock is a frequency lock, and wherein the at least proximal phase alignment is to a rising edge for all of the plurality of clock signals.

13. An apparatus, as in claim 11, wherein the select circuits are multiplexers.

14. An apparatus, as in claim 13, wherein each of the multiplexers have one input terminal coupled to receive the respective one of the plurality of output clock signals and another input terminal coupled to electrical ground.

15. An apparatus, as in claim 11, wherein the digital clock module is part of a field programmable gate array (FPGA) integrated circuit.

16. An apparatus, as in claim 15, wherein the state machine is configured in the FPGA integrated circuit with configurable logic.

17. An apparatus, as in claim 16, wherein the LCM clock signal and feedback clock signal are sent to respective buffers prior to being input to the state machine and the digital clock module, respectively.

18. An apparatus, as in claim 17, wherein the buffers are multiplexers configured for buffering.

19. An apparatus, as in claim 11, wherein the state machine comprises a register.

20. An apparatus, as in claim 11, wherein the state machine is configured to produce another control signal for adjusting phase, the other control signal provided to the digital clock module for phase adjustment of at least one of the plurality of output clock signals.

21. A test system for clock stabilization detection for hardware simulation of an integrated circuit, comprising:
a computer having a processor, an input/output interface and memory, the memory for storing target test results and a test program, the input/output interface for communicating with the integrated circuit;
a clock source for providing an input clock signal to the integrated circuit;
the integrated circuit configured with a clock stabilization circuit, the clock stabilization circuit configured to:
produce a feedback clock signal from the input clock signal;
produce an output clock signal from the input clock signal;
lock the feedback clock signal relative to the input clock signal to produce a lock signal indication of the lock;
generate a least common multiple (LCM) clock signal;
change state of a control signal to a first state partially responsive to the LCM clock signal and the lock signal;
detect at least proximal phase alignment between the LCM clock signal and the output clock signal for changing state of the control signal to a second state;
selectively apply the output clock signal to a design portion of the integrated circuit responsive to the control signal, the control signal selecting application of the output clock signal to the design portion after the lock and after detection of the at least proximal phase alignment of the LCM clock signal and the output clock signal; and
mask application of the output clock signal until the output clock signal is sufficiently stabilized as indicated by the control signal being in the second state for the hardware simulation to commence; and
the test program configured to cause test vectors to be applied responsive to the second state of the control signal, the test vectors applied to the design portion to obtain test results from the integrated circuit.

22. A test system, as in claim 21, where selective application of the output clock signal is done for at least approximate edge coincidence with another output clock signal.

23. A test system, as in claim 21, where selective application of the output clock signal is done for staggered edges with respect to another output clock signal.

24. A test system for clock stabilization detection for hardware simulation of an integrated circuit, comprising:
a computer having a processor, an input/output interface and memory, the memory for storing target test results and a test program, the input/output interface for communicating with the integrated circuit;
a clock source for providing an input clock signal to the integrated circuit;
the integrated circuit configured with a first portion of a clock stabilization design, the computer instantiated with a second portion of the clock stabilization design;
the first portion of the clock stabilization design configured to:
produce a feedback clock signal from the input clock signal;
produce an output clock signal from the input clock signal;
lock the feedback clock signal relative to the input clock signal to produce a lock signal indication of the lock; and
generate a least common multiple (LCM) clock signal;
the second portion of the clock stabilization design configured to:
change state of a control signal partially responsive to the LCM clock signal and the lock signal; and
detect at least proximal phase alignment between the LCM clock signal and the output clock signal for changing a state of the control signal;

the first portion of the clock stabilization design coupled to receive the control signal and configured to selectively apply the output clock signal to a design portion of the integrated circuit responsive to changing the state of the control signal;

the first portion of the clock stabilization design responsive to changing the state of the control signal selecting application of the output clock signal to the design portion after the lock and after detection of the at least proximal phase alignment of the LCM clock signal and the output clock signal;

the application of the output clock signal being masked until the output clock signal is sufficiently stabilized as indicated by the second portion of the clock stabilization design changing the state of the control signal for the hardware simulation of the design portion to begin; and the test program configured to cause test vectors to be applied responsive to changing the state of the control signal, the test vectors applied to the design portion to obtain test results from the integrated circuit.

* * * * *